United States Patent
Kanda (10) Patent No.: US 9,837,449 B2
(45) Date of Patent: Dec. 5, 2017

(54) DISPLAY DEVICE WITH CONTACT BETWEEN AN ELECTRODE OF A THIN FILM TRANSISTOR AND A PIXEL ELECTRODE

(71) Applicant: Japan Display Inc., Minato-ku (JP)

(72) Inventor: Noriyoshi Kanda, Tokyo (JP)

(73) Assignee: Japan Display Inc., Minato-ku (JP)

( * ) Notice: Subject to any disclaimer, the term of this patent is extended or adjusted under 35 U.S.C. 154(b) by 239 days.

(21) Appl. No.: 14/606,188

(22) Filed: Jan. 27, 2015

(65) Prior Publication Data

US 2015/0221732 A1 Aug. 6, 2015

(30) Foreign Application Priority Data

Jan. 31, 2014 (JP) .................. 2014-017731

(51) Int. Cl.
| | |
|---|---|
| *G02F 1/1343* | (2006.01) |
| *H01L 27/12* | (2006.01) |
| *G02F 1/1362* | (2006.01) |
| *G02F 1/1333* | (2006.01) |

(52) U.S. Cl.
CPC .... *H01L 27/1248* (2013.01); *G02F 1/136227* (2013.01); *H01L 27/124* (2013.01); *G02F 1/133345* (2013.01)

(58) Field of Classification Search
CPC ... G02F 1/136227; G02F 2001/134372; G02F 1/133345; G02F 2001/133357; G02F 1/134336; H01L 27/1248
See application file for complete search history.

(56) References Cited

U.S. PATENT DOCUMENTS 8,351,007 B2 * 1/2013 Kanaya ............ G02F 1/134363
349/141
2012/0314169 A1 12/2012 Naoe et al.
2013/0214299 A1 8/2013 Ryu et al.

FOREIGN PATENT DOCUMENTS

| JP | 2000-174128 | 6/2000 |
| JP | 2009-31468 A | 2/2009 |
| JP | 2013-3200 | 1/2013 |

OTHER PUBLICATIONS

U.S. Appl. No. 14/606,199, filed Jan. 27, 2015, Kanda.
Office Action dated Oct. 3, 2017, in Japanese Patent Application No. 2014-017731 (with English-language translation).

* cited by examiner

*Primary Examiner* — Paisley L Arendt
(74) *Attorney, Agent, or Firm* — Oblon, McClelland, Maier & Neustadt, L.L.P.

(57) ABSTRACT

There is provided an excellent contact between an electrode of a thin film transistor and a pixel electrode. A display device includes: an organic planarization film including a first contact hole opened on an electrode of a thin film transistor; an interlayer insulating film including a second contact hole opened on the electrode of the thin film transistor and on the organic planarization film; a base electrode that covers a portion where an end of the second contact hole overlaps a side wall of the first contact hole; and a pixel electrode contacted with the electrode of the thin film transistor.

20 Claims, 9 Drawing Sheets

DISPLAY DEVICE WITH CONTACT BETWEEN AN ELECTRODE OF A THIN FILM TRANSISTOR AND A PIXEL ELECTRODE

CLAIM OF PRIORITY

The present application claims priority from Japanese Patent Application JP2014-017731 filed on Jan. 31, 2014, the content of which is hereby incorporated by reference into this application.

BACKGROUND

The present disclosure relates to a display device, and is applicable to a display device having a contact hole that connects a pixel electrode to the electrode of a thin film transistor, for example.

An array substrate in a structure below is disclosed in FIG. 5 in Japanese Unexamined Patent Application Publication No. 2013-3200 and FIG. 5 in US Patent Application Publication No. 2012/0314169 corresponding to Japanese Unexamined Patent Application Publication No. 2013-3200.

A second contact hole on a third interlayer insulating film is formed at a position directly above a first contact hole. In other words, in the first contact hole, a relay electrode is stacked on an exposed drain electrode, and the relay electrode is covered with the third interlayer insulating film. The third interlayer insulating film includes the second contact hole in which the relay electrode in the first contact hole is exposed. In the second contact hole, a pixel electrode is stacked on the exposed relay electrode. As described above, a stacked body of the relay electrode and the pixel electrode is formed on the inner side of the first contact hole, and is not formed on the top face of the second interlayer insulating film. The relay electrode and the pixel electrode covering the top face of the second interlayer insulating film are further covered with the third interlayer insulating film, and the relay electrode formed in the first contact hole is covered with the third interlayer insulating film to nearly the center part of the relay electrode. The second interlayer insulating film is formed of a transparent organic material.

It is noted that the electrode of a thin film transistor electrically connected to the pixel electrode is sometimes referred to as a source electrode. However, in the following, in the present specification, the electrode is referred to as a drain electrode similarly in Japanese Unexamined Patent Application Publication No. 2013-3200.

SUMMARY

In the configuration of Japanese Unexamined Patent Application Publication No. 2013-3200 or US Patent Application Publication No. 2012/0314169 described above, in the case where the second interlayer insulating film thinly remains on the drain electrode, contact fails. When the relay electrode isolated on the drain electrode is removed, contact failure is eliminated by cutting and opening the second interlayer insulating film in etching the third interlayer insulating film. However, the second interlayer insulating film at the end portion of the contact hole on the second interlayer insulating film is also cut and notched in etching, and a gap is produced due to insufficient covering on the pixel electrode. Because of this, contact resistance is increased.

Other problems and novel features will be apparent from the description and accompanying drawings of the present disclosure.

In the present disclosure, the following is a brief summary of representative aspects.

In other words, a display device includes an array substrate and a counter substrate. The array substrate includes: an electrode of a thin film transistor; a first interlayer film that covers the electrode of the thin film transistor; a common electrode provided on the first interlayer; a first electrode provided on the same layer as the common electrode and isolated from the common electrode; a second interlayer film that covers the common electrode; and a pixel electrode provided on the second interlayer. The first interlayer film includes a first contact hole opened on the electrode of the thin film transistor. The second interlayer film includes a second contact hole opened on the electrode of the thin film transistor and on the first interlayer film. The first electrode covers a portion where the end of the second contact hole overlaps the side wall of the first contact hole. The pixel electrode is contacted with the electrode of the thin film transistor.

DESCRIPTION OF THE PREFERRED EMBODIMENTS

In the following, an embodiment, an example, and comparative examples will be described with reference to the drawings. It is noted that the disclosure is merely an example, and appropriate modifications that can be easily conceived by a person skilled in the art within the teachings of the present invention are of course included in the scope of the present invention. Moreover, in order to make the description clearer, components are sometimes schematically illustrated on widths, thicknesses, shapes, and the like as compared with the actual forms. However, these are only examples, and will not limit the interpretation of the present invention. Furthermore, in the specification and the drawings, components similar to ones described in the drawings already mentioned are sometimes designated the same reference numerals and signs for appropriately omitting the detailed description.

First, problems of a display device according to a first comparative example will be described with reference to FIGS. 1A to 1C.

Figure 1A:
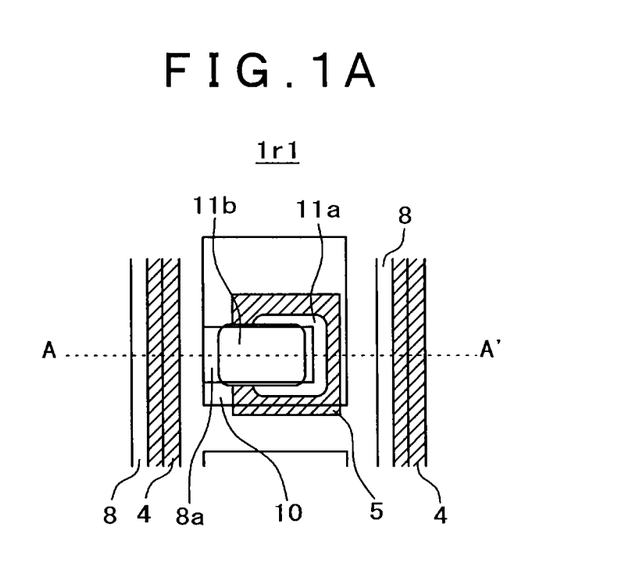
FIG. 1A is a plan view of the configuration of a display device according to a first comparative example.
Figure 1B:
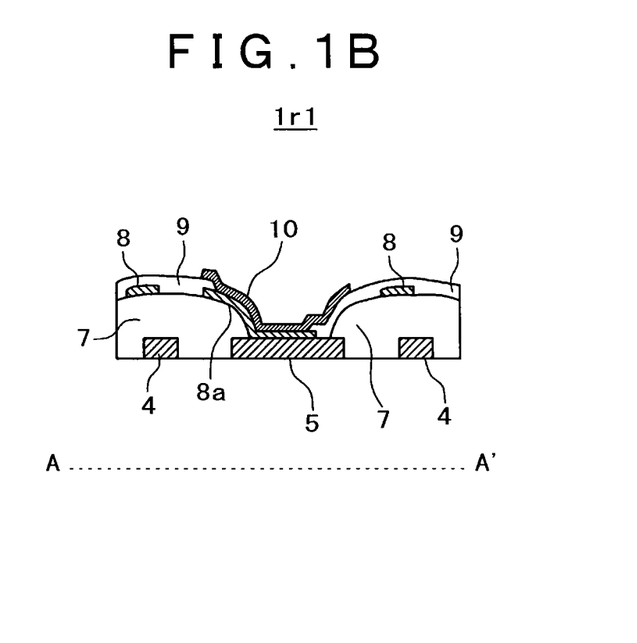
FIG. 1B is a cross sectional view taken along line A-As in FIG. 1A.
Figure 1C:
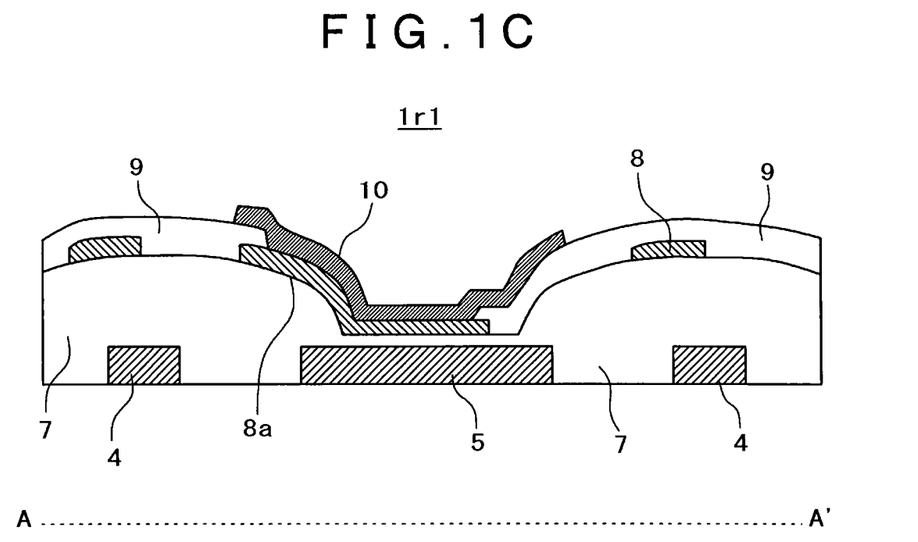
FIG. 1C is a cross sectional view of problems of the display device according to the first comparative example.

FIG. 1A is a plan view of the configuration of the display device according to the first comparative example. FIG. 1B is a cross sectional view taken along line A-A' in FIG. 1A. FIG. 1C is a cross sectional view of problems of the display device according to the first comparative example.

In a display device 1r1 according to the first comparative example, a first interlayer film 7 is formed on a source electrode 4 and a drain electrode 5 of a thin film transistor (in the following, referred to as a TFT). A hole is formed on the first interlayer film 7, and a first contact hole 11a is formed on the drain electrode 5 of the TFT. On the first interlayer film 7 and the first contact hole 11a, a transparent conductive film is formed and patterned to form a common electrode (a counter electrode) 8 and an electrode 8a. The electrode 8a is also referred to as a first electrode, a relay electrode, a connection electrode, or a base electrode. The common electrode 8 is formed on the first interlayer film 7. The electrode 8a is formed on the bottom face and at least one side surface of the first contact hole 11a. A second interlayer film 9 is formed on the common electrode 8 and the electrode 8a and on the upper part and side wall of the first interlayer film 7, a hole is formed on the second interlayer film 9, and a second contact hole 11b is formed on the electrode 8a. It is noted that the electrode 8a is an etch stopper for the second interlayer film 9. On the second interlayer film 9 and the second contact hole 11b, a transparent conductive film is formed and patterned to form a pixel electrode 10. The first contact hole 11a and the second contact hole 11b are disposed as the holes are displaced from each other in a planar view. In other words, the first contact hole 11a partially overlaps the second contact hole 11b in a planar view. The first interlayer film 7 covers a part of the drain electrode 5. The electrode 8a is contacted with the upper parts of the drain electrode 5 and the first interlayer film 7. The second interlayer film 9 is contacted with the upper apart of the drain electrode 5. The second interlayer film 9 covers a part of the electrode 8a. The pixel electrode 10 is contacted with the electrode 8a.

In the case where the first interlayer film 7 is formed of a photosensitive organic material, the first interlayer film 7 is exposed and developed but the first interlayer film 7 is not etched in patterning. Therefore, as illustrated in FIG. 1C, the first interlayer film 7 remains on the drain electrode 5 caused by variations in the film thickness of the coating of the photosensitive organic material, variations in the uniformity of the application of an exposure system, soil on a mask, or the like, the electrode 8a is not enabled to contact the drain electrode 5, and it is likely to cause the contact failure of the pixel electrode.

Next, problems of a display device according to a second comparative example will be described with reference to FIGS. 2A and 2B.

Figure 2A:
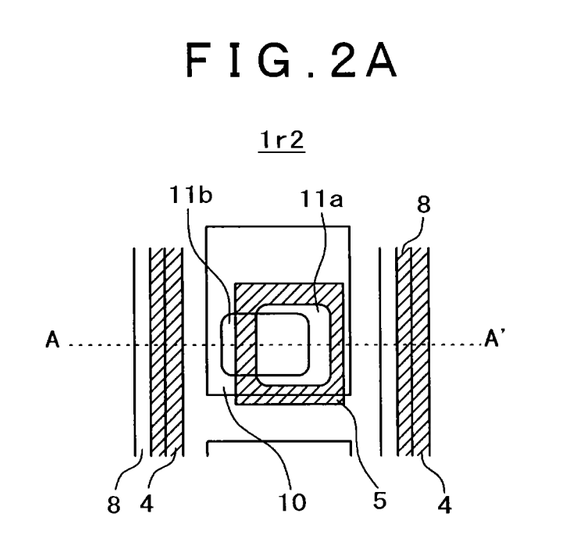
FIG. 2A is a plan view of the configuration of a display device according to a second comparative example.
Figure 2B:
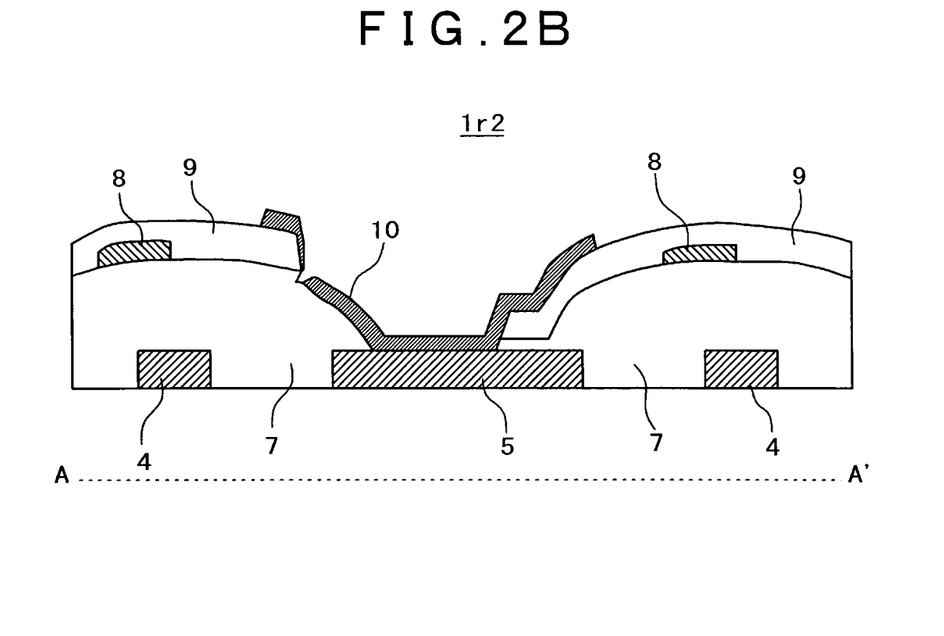
FIG. 2B is a cross sectional view of problems of the display device according to the second comparative example.

FIG. 2A is a plan view of the configuration of the display device according to the second comparative example. FIG. 2B is a cross sectional view of problems of the display device according to the second comparative example.

In a display device 1r2 according to the second comparative example, an electrode 8a is removed from the display device 1r1 according to the first comparative example, and the other configurations are the same.

The electrode 8a is removed by etching, so that a first interlayer film 7 can be removed when a second interlayer film 9 is etched to form a second contact hole 11b even though the first interlayer film 7 remains on a drain electrode 5, and a first contact hole 11a can be opened. Therefore, the contact failure of a pixel electrode like the first comparative example can be avoided.

In the first comparative example, the electrode 8a is an etch stopper for the second interlayer film 9. However, in the second comparative example, since the electrode 8a is removed, the first interlayer film 7 at the end of the second contact hole 11b is sometimes cut when the second interlayer film 9 is etched to form the second contact hole 11b. Therefore, as illustrated in FIG. 2B, it is likely that a gap is produced due to insufficient covering of a transparent conductive film that forms a pixel electrode 10 and contact resistance is increased.

Next, the structure of a display device according to an embodiment will be described with reference to FIGS. 3A to 3C.

Figure 3A:
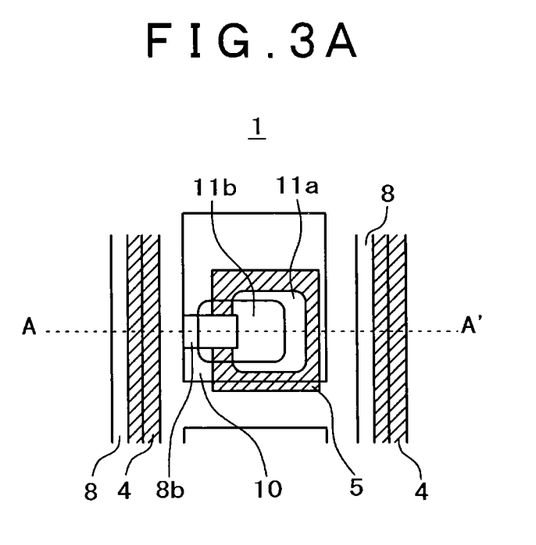
FIG. 3A is a plan view of the configuration of a display device according to an embodiment.
Figure 3B:
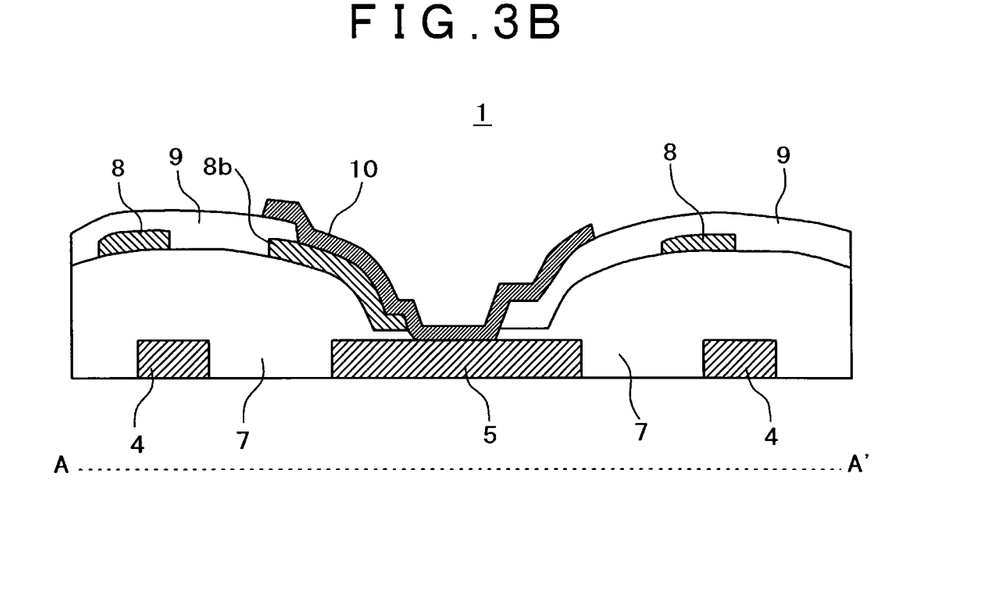
FIG. 3B is a cross sectional view taken along line A-A' in FIG. 3A.

FIG. 3A is a plan view of the configuration of the display device according to the embodiment. FIG. 3B is a cross sectional view taken along line A-A' in FIG. 3A. FIG. 3C is a cross sectional view of the effect of the display device according to the embodiment.

A display device 1 according to the embodiment is different from the display device 1r1 according to the first comparative example in the pattern of forming a base electrode. In other words, the display device 1 is in a structure in which a portion where the end of a second contact hole 11b overlaps the side wall of a first contact hole 11a (the side wall of a first interlayer film 7) is covered with an electrode 8b, only a part of the bottom of the first contact hole 11a is covered with the electrode 8b, and the most part of the first contact hole 11a is not covered with the electrode 8b (the most part is opened). The electrode 8b is also referred to as a first electrode, a relay electrode, a connection electrode, or a base electrode.

A hole is formed on the first interlayer film 7, and the first contact hole 11a is formed on an electrode (a drain electrode) 5 of a TFT. A transparent conductive film is formed and patterned on the first interlayer film 7 to form a common electrode 8 and the electrode 8b. It is noted that the electrode 8b is isolated from the common electrode 8, and is insulated from the common electrode 8 by a second interlayer film 9, described later. The second interlayer film 9 is formed on the common electrode 8 and the electrode 8b, and on the upper part and side wall of the first interlayer film 7. A hole is formed on the second interlayer film 9, and the second contact hole 11b is formed on the electrode 8b. On the second interlayer film 9 and the second contact hole 11b, a transparent conductive film is formed and patterned to form a pixel electrode 10. The first contact hole 11a and the second contact hole 11b are disposed as the holes are displaced from each other in a planar view. In other words, the first contact hole 11a partially overlaps the second contact hole 11b in a planar view. The first interlayer film 7 covers a part of the drain electrode 5. The electrode 8b covers a part of the upper parts of the drain electrode 5 and the first interlayer film 7. However, in the case where the first interlayer film 7 remains on the drain electrode 5, which is the bottom face of the first contact hole 11a, the electrode 8b covers a part of the upper part of the drain electrode 5 but the electrode 8b is not contacted with the drain electrode 5. It is noted that the electrode 8b is contacted with the first interlayer film 7. The second interlayer film 9 covers a part of the upper part of the drain electrode 5. However, in the case where the first interlayer film 7 remains on the drain electrode 5, which is the bottom face of the first contact hole 11a, the second interlayer film 9 covers a part of the upper part of the drain electrode 5 but the second interlayer film 9 is not contact the drain electrode 5. The second interlayer film 9 covers a part of the electrode 8b. The pixel electrode 10 is concerted with the electrode 8b. It is noted that FIG. 3B is the case where the first interlayer film 7 remains on the drain electrode 5, which is the bottom face of the first contact hole 1a.

The first interlayer film 7 can be removed by etching when the second interlayer film 9 is etched to form the second contact hole 11b even though the first interlayer film 7 remains on the drain electrode 5, and the first contact hole 11a can be opened, so that the contact between the pixel electrode 10 and the drain electrode 5 can be secured. Therefore, an unlit defect caused by contact failure can be eliminated.

The first interlayer film 7 at the end of the second contact hole 11b is covered with the electrode 8b, so that an insertion caused by cutting the first interlayer film 7 can be prevented in etching the second interlayer film 9 and a gap in the electrode 8b can be eliminated.

Figure 3C:
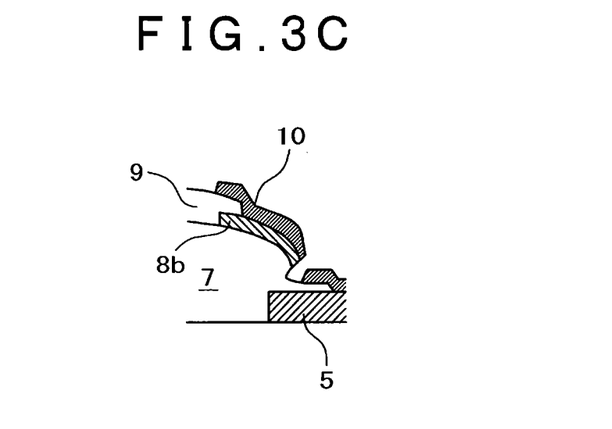
FIG. 3C is a cross sectional view of the effect of the display device according to the embodiment.

When the electrode 8b does not cover the bottom face of the first contact hole 11a, it is likely that the first interlayer film 7 is cut at the end portion of the electrode 8b and a gap is produced in the pixel electrode 10 as illustrated in FIG. 3C. A part of the bottom face of the first contact hole 11a is covered with the electrode 8b, so that the first interlayer film 7 can be prevented from being cut at the end portion of the electrode 8b, and a gap in the pixel electrode 10 can be eliminated. Pixel contact resistance can be decreased.

A manufacturing method of the display device according to the embodiment will be described with reference to FIG. 4.

Figure 4:
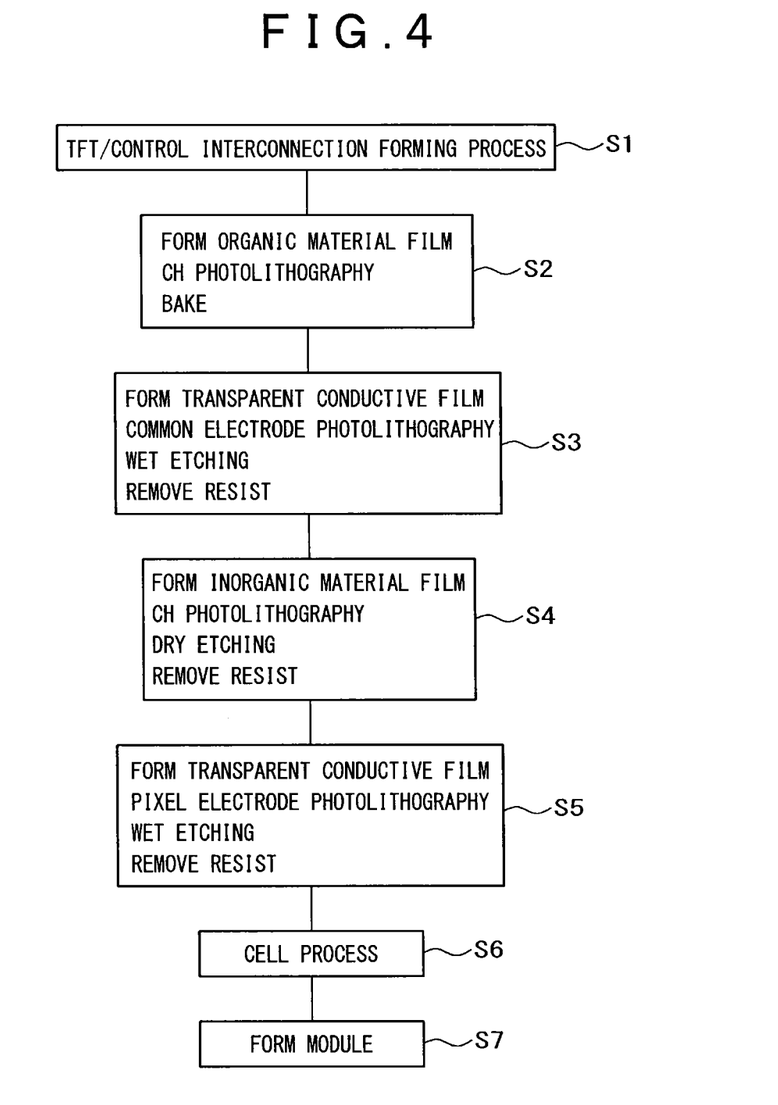
FIG. 4 is a flowchart of a manufacturing method of the display device according to the embodiment.

FIG. 4 is a flowchart of a manufacturing method of the display device according to the embodiment. It is noted that the manufacturing flows of the embodiment, the first comparative example, and the second comparative example are the same and the difference is only mask patterns used in photolithography in Step S3, described later.

On a transparent substrate such as glass, TFTs, control interconnections that control the TFTs (a gate electrode interconnection, a source electrode interconnection, and a drain electrode interconnection), and the like are formed (Step S1).

An organic material such as a photosensitive resin is formed throughout on the surface, photolithography and baking are performed, and the first contact hole (CH) 11a is formed on the first interlayer film 7 (Step S2). Here, photolithography means that a photosensitive material such as a photoresist is exposed and developed using a mask pattern and a pattern is formed on the photosensitive material.

A transparent conductive film is formed throughout on the surface, photolithography, wet etching, and removal of a resist are performed, and the common electrode 8 and the electrode 8b are formed (Step S3).

An inorganic material is formed throughout on the surface, photolithography, dry etching, and removal of a resist are performed, and the second contact hole 11b is formed on the second interlayer film 9 (Step S4).

A transparent conductive film is formed throughout on the surface, photolithography, wet etching, and removal of a resist are performed, and the pixel electrode 10 is formed (Step S5).

In a cell process, the alignment film is formed, rubbing or UV ray application is performed for alignment, the TFT substrate is bonded to the counter substrate with a sealing material to seal liquid crystals, and a polarizer is mounted (Step S6). In forming a module, a driver IC, flat cables, a backlight, and the like are mounted (Step S7).

In the example below, an IPS (In Plane Switching) display device will be described. However, the disclosure is not limited to the IPS display device, and is applicable to an FFS (Fringe Field Switching) lateral field display device, for example.

EXAMPLE

First, the structure of a display device according to an example will be described with reference to FIGS. 5 to 8.

Figure 5:
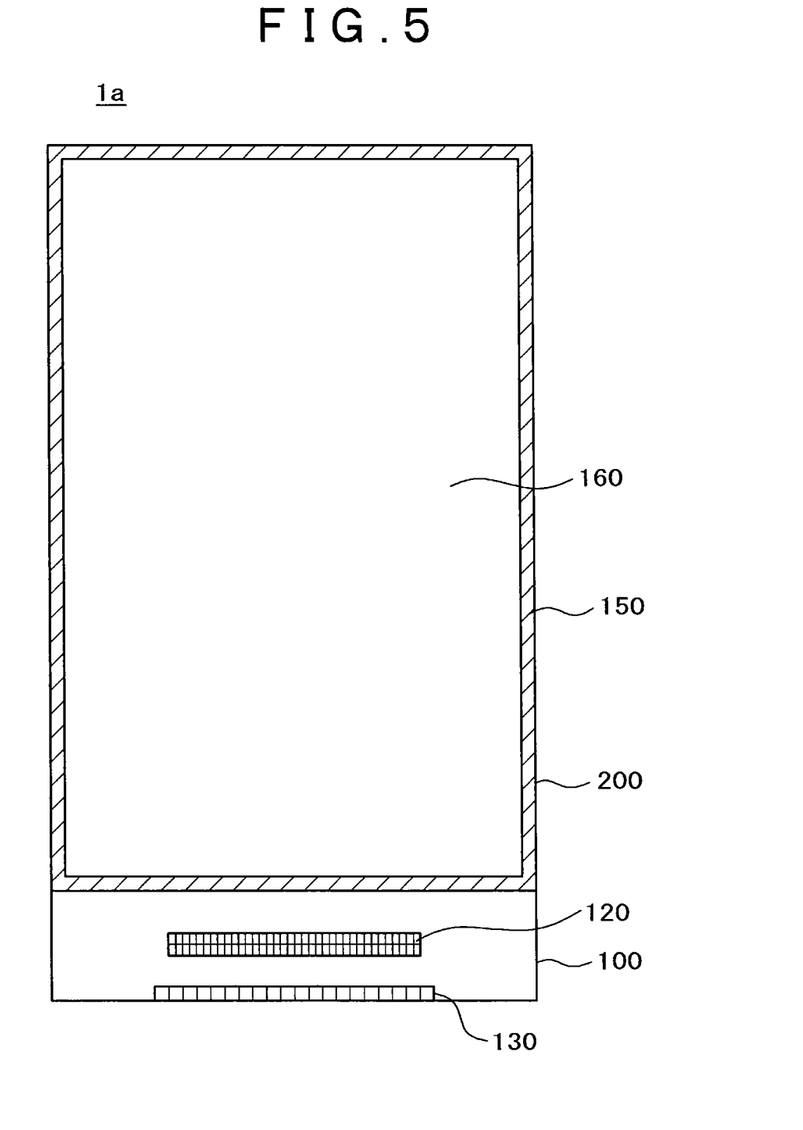
FIG. 5 is a plan view of a display device according to an example.
Figure 6:
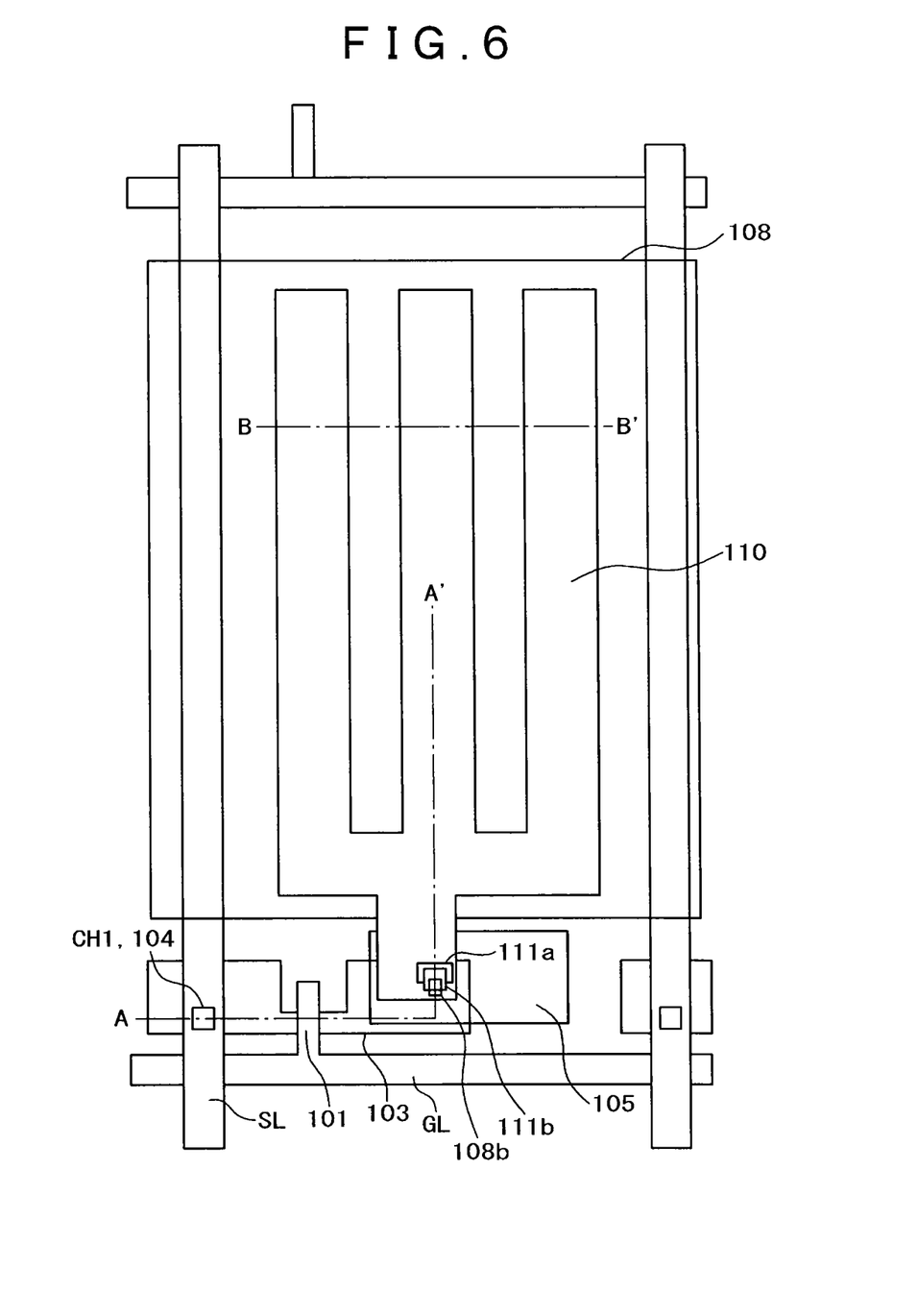
FIG. 6 is a plan view of the structure of a pixel portion on a display region of the display device according to the example.
Figure 7:
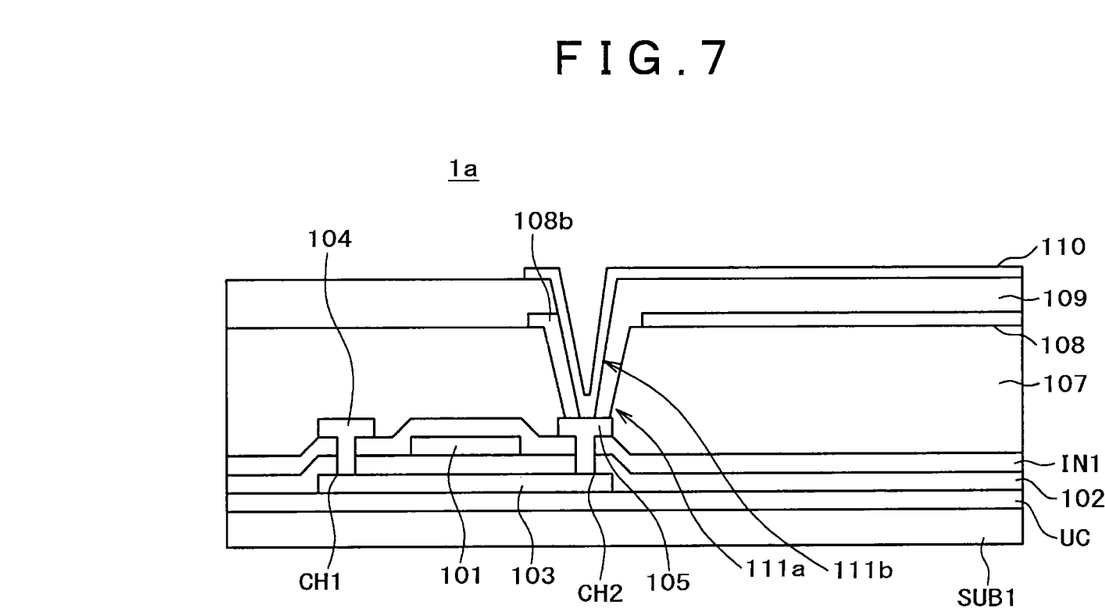
FIG. 7 is a cross sectional view taken along line A-A' in FIG. 6.
Figure 8:
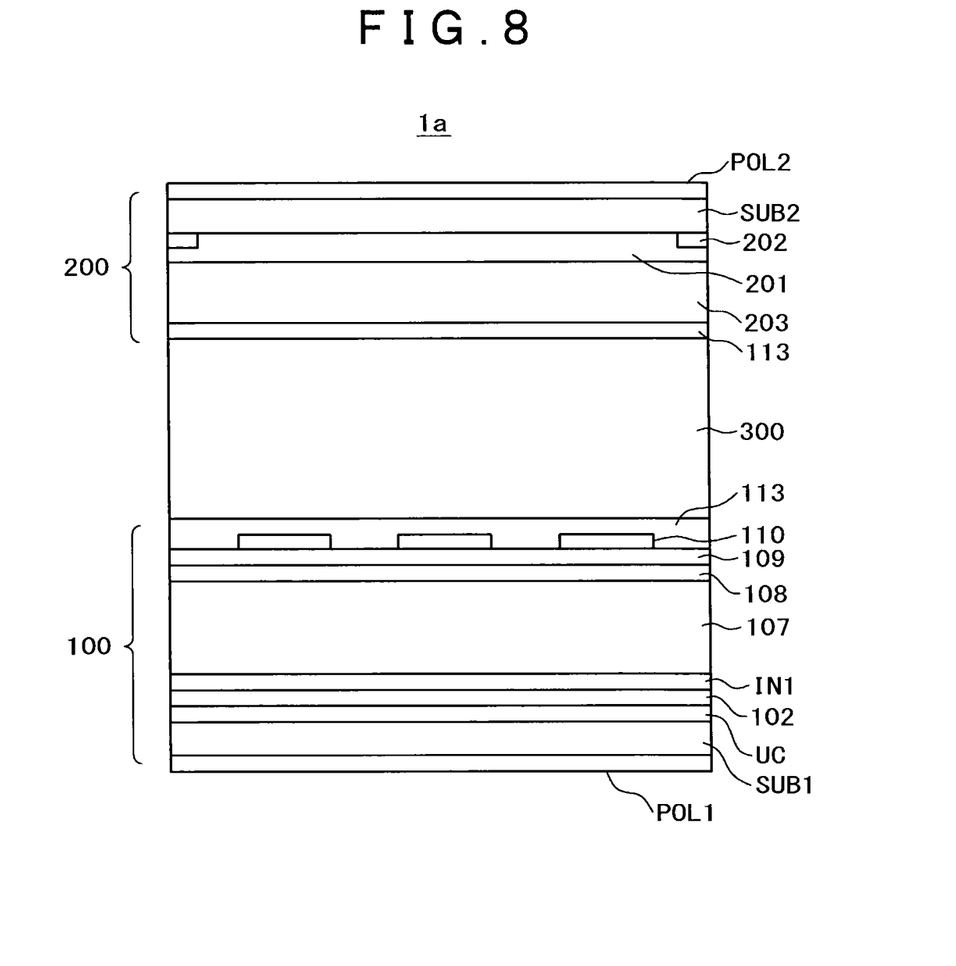
FIG. 8 is a cross sectional view taken along line B-B' in FIG. 6.

FIG. 5 is a plan view of the display device according to the example. FIG. 6 is a plan view of the structure of a pixel portion on a display region of the display device according to the example. FIG. 7 is a cross sectional view taken along line A-A' in FIG. 6. FIG. 8 is a cross sectional view taken along line B-B' in FIG. 6.

As illustrated in FIG. 5, a display device 1a includes an array substrate (a TFT substrate) 100, a counter substrate (a CF substrate) 200, and a liquid crystal layer 300 sandwiched between the array substrate 100 and the counter substrate 200. The counter substrate 200 is attached to the array substrate 100 through a sealing material 150. A display region 160 of the array substrate 100 includes scanning signal lines, image signal lines, and pixels formed in a matrix configuration. The pixel includes a TFT and a pixel electrode. The counter substrate 200 includes a color filter and the like.

The array substrate 100 is formed greater than the counter substrate 200. A portion where only the array substrate 100 is provided is a terminal region in which an IC terminal 120 that connects a driver IC and the like, a flexible circuit board terminal 130 that connects an external circuit, and the like are formed.

The display device 1a is an active matrix liquid crystal display device, in which a plurality of the pixels is disposed in a matrix configuration. The array substrate 100 includes a plurality of scanning signal lines GL and a plurality of image signal lines SL intersecting with the plurality of the scanning signal lines GL. The TFT is provided near intersection points for the switching device of the pixel.

As illustrated in FIG. 6, a pixel electrode 110 has linear portions, and formed in a comb teeth shape. A common electrode 108 is formed in a plane shape. An electric field generated across the pixel electrode 110 and the common electrode 108 drives the liquid crystal layer 300 for display. It is noted that in FIG. 6, one pixel is illustrated in the plurality of the pixels disposed in a matrix configuration.

As illustrated in FIGS. 7 and 8, on a transparent insulating substrate SUB1 such as glass, an under coat film UC, a semiconductor film 103 such as polysilicon, a gate insulating film 102, a gate electrode 101 of the TFT, and an interlayer insulating film IN1 are formed from the lower layers. On the interlayer insulating film IN1, a source electrode 104 of the TFT and a drain electrode 105 of the TFT are formed. An aluminum silicon alloy and a molybdenum tungsten alloy, for example, are used for the source electrode 104 and the drain electrode 105.

The gate electrode 101 is integrally formed with the scanning signal line GL. A part of the image signal line SL also serves as the source electrode 104 in the structure in which the image signal line SL is connected to the source electrode 104. The source electrode 104 is connected to the source region (the semiconductor film 103) of the TFT through a contact hole CH1 formed on the gate insulating film 102 and the interlayer insulating film IN1. The drain electrode 105 is connected to the drain region (the semiconductor film 103) of the TFT through a contact hole CH2 formed on the gate insulating film 102 and the interlayer insulating film IN1.

On the source electrode 104 and the drain electrode 105, an organic insulating film (a first interlayer film) 107 is formed. For the organic insulating film 107, for example, a photosensitive acrylic resin and the like are preferably used. The organic insulating film 107 is used, so that flatness can be increased as compared with the case where an inorganic insulating film is used. The organic insulating film 107 is also referred to as an organic planarization film. Moreover, a thick film is easily formed, so that a parasitic capacitance can be decreased. On the organic insulating film 107, a contact hole (a first contact hole) 111a is formed.

On the organic insulating film 107, the common electrode (the counter electrode) 108 and the electrode 108b are formed. The electrode 108b is also referred to as a first electrode, a relay electrode, a connection electrode, or a base electrode. On the common electrode 108 and the electrode 108b, an interlayer insulating film (a second interlayer film) 109 is formed. It is noted that the electrode 108b is isolated from the common electrode 108, and is insulated from the common electrode 108 by the interlayer insulating film 109. A film of the interlayer insulating film 109 is formed on the upper parts and side walls of the common electrode 108, the electrode 108b, and the organic insulating film 107. A hole is formed on the interlayer insulating film 109, and a second contact hole 111b is formed on the electrode 108b. The first contact hole 111a is displaced from the second contact hole 111b in a planar view. In other words, the first contact hole 111a partially overlaps the second contact hole 111b in a planar view. The organic insulating film 107 covers a part of the drain electrode 105. The electrode 108b covers a part of the upper parts of the drain electrode 105 and the organic insulating film 107. However, in the case where the organic insulating film 107 remains on the drain electrode 105, which is the bottom face of the first contact hole 111a, the electrode 108b covers a part of the upper part of the drain electrode 105 but the electrode 108b is not contacted with the drain electrode 105. It is noted that the electrode 108b is contacted with the organic insulating film 107. The interlayer insulating film 109 covers a part of the upper part of the drain electrode 105. However, in the case where the organic insulating film 107 remains on the drain electrode 105, which is the bottom face of the first contact hole 111a, the interlayer insulating film 109 covers a part of the upper part of the drain electrode 105 but the interlayer insulating film 109 is not contacted with the drain electrode 105. The interlayer insulating film 109 covers a part of the electrode 108b.

On the interlayer insulating film 109 and the second contact hole 111b, a transparent conductive film is formed and patterned to form the pixel electrode 110. The pixel electrode 110 is connected to the drain electrode 105 of the TFT through the contact hole (the second contact hole) 111b formed on the interlayer insulating film 109. The pixel electrode 110, the common electrode 108, and the electrode 108b are formed of a transparent conductive film such as ITO (Indium Tin Oxide) and IZO (Indium Zinc Oxide), for example.

A common potential different from a potential applied to the pixel electrode 110 is supplied to the common electrode 108. Therefore, the common electrode 108, the pixel electrode 110, and the interlayer insulating film 109 form a retention capacitance. In other words, the common electrode 108 also serves as a capacitive electrode. Here, when a silicon nitride film (SiN) is used for the interlayer insulating film 109, the dielectric constant is high as compared with the case where a silicon oxide film ($SiO_2$) is used. Thus, the retention capacitance can be increased. Moreover, when the pixel electrode 110 and the common electrode 108 are formed of a transparent conductive film, a transparent retention capacitance can be formed, so that the aperture ratio can be increased.

The interlayer insulating film 109 is formed above the organic insulating film 107. Since the organic insulating film 107 generally has heat-resisting properties that are not so excellent, the interlayer insulating film 109 is formed by plasma CVD. In order to increase a dielectric constant, a silicon nitride film is adopted for the interlayer insulating film 109.

On the pixel electrode 110, an alignment film 113 is formed. Moreover, on the substrate SUB1 on the opposite side of the liquid crystal layer 300, a polarizer POL1 is disposed. It is noted that the alignment film 113 and the polarizer POL1 are omitted in FIG. 7.

As illustrated in FIG. 8, on a transparent insulating substrate SUB2 such as glass, a black matrix 202, a color filter 201, an overcoat film 203, and an alignment film 113 are formed. Moreover, on the substrate SUB2 on the opposite side of the liquid crystal layer 300, a polarizer POL2 is disposed.

Next, an exemplary manufacturing method according to the example will be described.

After the TFT is formed by a general method, on the source electrode 104 and the drain electrode 105, a photosensitive acrylic resin, for example, is applied, exposed, and patterned to form the organic insulating film 107 and the contact hole 111a. The thickness is 2.2 μm.

Subsequently, on the organic insulating film 107, ITO is formed in a thickness of 77 nm, and patterned to form the common electrode 108 and the electrode 108b. Here, the drain electrode 105 has a three-layer structure in which the upper layer is a molybdenum tungsten alloy (MoW) in a thickness of 75 nm, the middle layer is an aluminum silicon alloy (AlSi) including 1% of Si in a thickness of 500 nm, and the lower layer is a molybdenum tungsten alloy (MoW) in a thickness of 40 nm.

Subsequently, on the common electrode 108 and the electrode 108b, a silicon nitride film (SiN) is formed as the interlayer insulating film 109 by plasma CVD. In consideration of the influence on the organic insulating film 107, which is disposed below the interlayer insulating film 109, the film forming conditions at this time are in which the film is formed at low temperatures that are the heatproof temperature of the organic insulating film 107 or less, the film forming temperature (the substrate temperature) ranges from temperatures of 180 to 250° C. (desirably a temperature of 220° C.), and the film thickness ranges from 100 to 500 nm (desirably a thickness of 300 nm). Moreover, at this time, a gas flow ratio of monosilane ($SiH_4$) to ammonia ($NH_3$), which are material gases in forming the film by plasma CVD, is a ratio of 1:6.

Subsequently, a photoresist is formed. The photoresist is used as a mask, the interlayer insulating film 109 is etched, and the contact hole 111b is formed. For an etching gas, a mixed gas of sulfur hexafluoride ($SF_6$) and oxygen ($O_2$) is used for dry etching. After that, the photoresist is removed.

21 Subsequently, the pixel electrode 110 is formed on the interlayer insulating film 109 with ITO. The film thickness is 77 nm.

What is claimed is:

1. A display device comprising:
an array substrate; and
a counter substrate,
wherein: the array substrate includes:
   a thin film transistor including a semiconductor film;
   an interlayer film that covers the semiconductor film, and that includes a contact hole;
   an electrode connected with the semiconductor film via the contact hole;
   a first interlayer film that covers the electrode;
   a common electrode provided on the first interlayer film;
   a first electrode provided on a same layer as the common electrode and isolated from the common electrode;
   a second interlayer film that covers the common electrode; and
   a pixel electrode provided on the second interlayer film;
the first interlayer film includes a first contact hole opened on the electrode;
the second interlayer film includes a second contact hole opened on the electrode and on the first interlayer film;
the first electrode covers a portion of the first interlayer film from an end of the second contact hole extending toward an end of the first contact hole; and
the pixel electrode is directly contacted with the electrode at a bottom of the first contact hole.

2. The display device according to claim 1, wherein the pixel electrode is contacted with the first electrode.

3. The display device according to claim 1, wherein the first electrode and the second interlayer film cover a part of the electrode.

4. The display device according to claim 1, wherein the second interlayer film covers a part of the first electrode.

5. The display device according to claim 4, wherein the pixel electrode extends over a portion where the second interlayer film covers the first electrode.

6. The display device according to claim 1, wherein the first interlayer film covers a part of the electrode.

7. The display device according to claim 1, wherein the first interlayer film is an organic film.

8. The display device according to claim 1, wherein the first interlayer film is formed of a photosensitive resin.

9. The display device according to claim 1, wherein the first interlayer film is a planarization film.

10. The display device according to claim 1, wherein the second interlayer film is a silicon nitride film (SiN).

11. The display device according to claim 1, wherein the second interlayer film is an interlayer insulating film.

12. The display device according to claim 1,
wherein: a liquid crystal layer sandwiched between the array substrate and the counter substrate is included;
the array substrate includes an alignment film that covers the pixel electrode; and
the counter substrate includes an alignment film.

13. A display device comprising:
a thin film transistor including a semiconductor film;
an interlayer film that covers the semiconductor film, and that includes a contact hole;
a drain electrode connected with the semiconductor film via the contact hole;
an organic planarization film that covers the drain electrode;
a common electrode provided on the organic planarization film;
a base electrode provided on a same layer as the common electrode and isolated from the common electrode;
an interlayer insulating film that covers the common electrode; and
a pixel electrode provided on the organic planarization film,
wherein: the organic planarization film includes a first contact hole opened on the drain electrode;
the interlayer insulating film includes a second contact hole opened on the drain electrode and on the organic planarization film;
the base electrode covers a portion of the organic planarization film from an end of the second contact hole extending toward an end of the first contact hole; and
the pixel electrode is directly contacted with the drain electrode at a bottom of the first contact hole.

14. The display device according to claim 13, wherein the pixel electrode is contacted with the base electrode.

15. The display device according to claim 13, wherein the base electrode and the interlayer insulating film cover a part of the drain electrode.

16. The display device according to claim 13, wherein the interlayer insulating film covers a part of the base electrode.

17. The display device according to claim 16, wherein the pixel electrode extends over a portion where the interlayer insulating film covers the base electrode.

18. The display device according to claim 13, wherein the organic planarization film covers a part of the drain electrode.

19. The display device according to claim 13, wherein the organic planarization film is formed of a photosensitive resin.

20. The display device according to claim 13, wherein the interlayer insulating film is a silicon nitride film (SiN).

* * * * *